United States Patent [19]

Banker et al.

[11] Patent Number: 4,709,166

[45] Date of Patent: Nov. 24, 1987

[54] COMPLEMENTARY CASCODED LOGIC CIRCUIT

[75] Inventors: Dennis C. Banker, Newburgh; Jack A. Dorler, Holmes; John N. Hryckowian, Poughkeepsie, all of N.Y.

[73] Assignee: International Business Machines Corporation, Armonk, N.Y.

[21] Appl. No.: 865,700

[22] Filed: May 22, 1986

[51] Int. Cl.$^4$ .................. G06F 11/16; G06F 7/34; H03K 19/003; H03K 19/088

[52] U.S. Cl. .................. 307/441; 307/219; 307/456; 307/300; 371/14; 371/68

[58] Field of Search ............... 307/441, 219, 443, 456, 307/458, 355, 270, 300, 255; 371/14, 67-69

[56] References Cited

U.S. PATENT DOCUMENTS

| | | | |
|---|---|---|---|
| 2,942,193 | 6/1960 | Tryon | 307/441 |
| 3,305,830 | 2/1967 | Constantine, Jr. | 307/441 X |
| 3,450,896 | 6/1969 | Taniguchi et al. | 307/297 |
| 3,458,719 | 7/1969 | Weiss | 307/300 X |
| 3,522,446 | 8/1970 | Kodama | 307/270 |
| 3,543,048 | 11/1970 | Klaschka | 307/441 |
| 3,579,272 | 5/1971 | Foss | 307/455 |
| 3,656,004 | 4/1972 | Kemerer et al. | 307/246 |
| 3,787,737 | 1/1974 | Mukai | 307/300 |
| 3,836,792 | 9/1974 | Eckert, Jr. et al. | 307/300 |
| 4,039,867 | 8/1977 | Blumberg et al. | 307/255 |
| 4,112,314 | 9/1978 | Gani et al. | 307/317 A |
| 4,321,490 | 3/1982 | Bechdolt | 307/456 |
| 4,339,676 | 7/1982 | Ramsey | 307/473 |
| 4,605,870 | 8/1986 | Dansky et al. | 307/456 X |
| 4,621,201 | 11/1986 | Amdahl et al. | 307/441 X |

OTHER PUBLICATIONS

"Voltage Booster", by A. H. Dansky, M. M. Savale and H. Schettler, IBM Technical Disclosure Bulletin, vol. 26, No. 7B, Dec. 1983, p. 3618.

*Primary Examiner*—Stanley D. Miller
*Assistant Examiner*—David R. Bertelson
*Attorney, Agent, or Firm*—Wesley DeBruin

[57] ABSTRACT

Disclosed is a Complementary Cascoded Logic (C$^2$L) Circuit which performs the AND-INVERT (AI) (or NAND) function. The AND function is implemented with input PNP transistors and the invert function is implemented with a first NPN transistor. An inverted NPN transistor serves as a current source for the first NPN. A first low voltage Schottky diode is serially connected between the emitter of the first NPN transistor and the emitter of the inverted NPN current source transistor. The first Schottky diode precludes, under certain conditions, simultaneous conduction of the first NPN transistor and the inverted transistor. Oppositely poled second and third low voltage Schottky diodes are utilized via an emitter follower output to provide an output voltage swing of $V_R \pm V_F$, where $V_R$ is a reference voltage and $V_F$ is the potential drop across a Schottky diode. The low power high speed logic circuit (C$^2$L) has particular utility in redundant circuit applications.

17 Claims, 4 Drawing Figures

ACTIVE REDUNDANCY

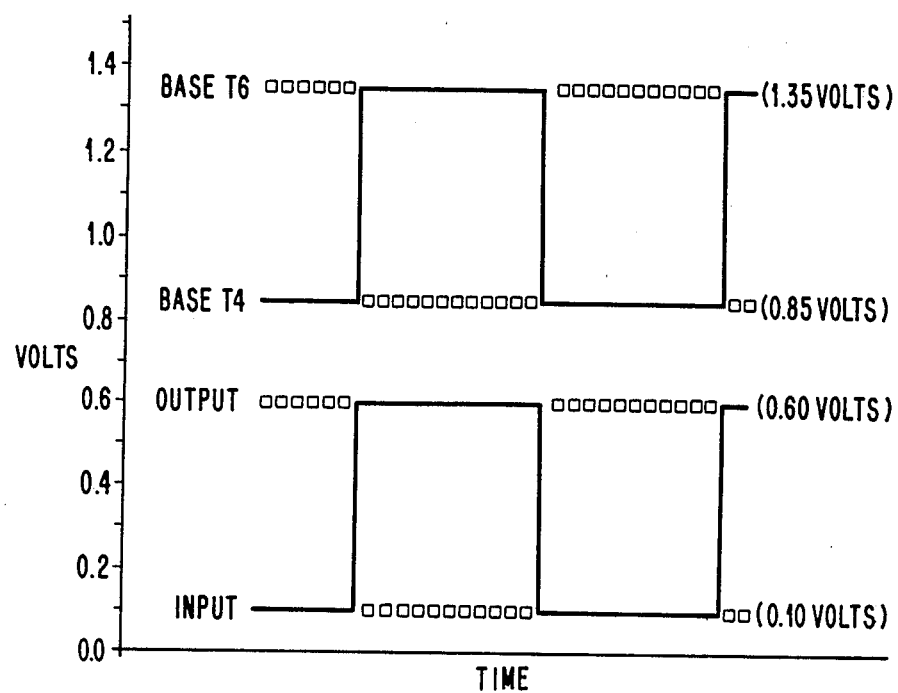
FIG. 2
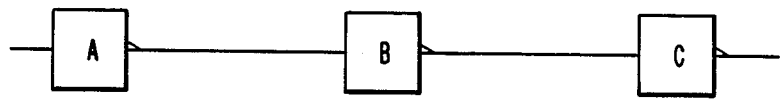
FIG. 3A   NON REDUNDANT LOGIC
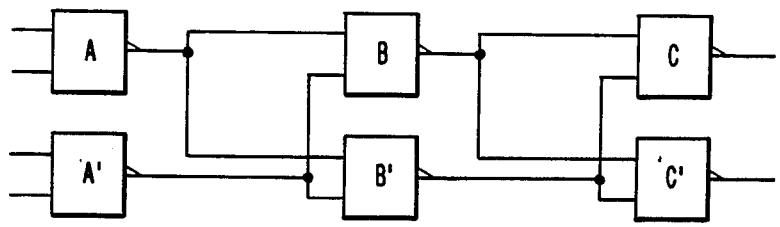
FIG. 3B   ACTIVE REDUNDANCY

COMPLEMENTARY CASCODED LOGIC CIRCUIT

FIELD OF THE INVENTION

The invention relates to high speed logic circuits of low power consumption suitable for very large scale integration (VLSI) in which a sizable number of circuits are integrated on a single semiconductor chip.

Electronic devices continue to show a trend to be smaller by the use of integrated circuits, and such trend is very important to lower the cost and to increase the operating speed of such devices by reducing the signal propagation delay time.

However, when the apparatus is made smaller, the packing density of the circuit will increase and the method of disipating the heat generated in the circuit will become a problem. Usually the power dissipation per unit circuit is larger in a high speed logic circuit than in a low speed logic circuit. It is all the more difficult in the high speed logic circuit to make the apparatus small. Particularly it is very difficult to produce VLSI in which several thousand logic gates are integrated on a semiconductor chip of several $MM^2$, from the conventional high speed logic circuits.

As a technique of reducing the power dissipation in a logic circuit without affecting the operating speed, the variation of the stored energy required for logic operation has been minimized by reducing the stored energy in the circuit and to make the source voltage as low as possible.

Among already extensively used logic circuits are, for example, saturation mode logic using a common emitter transistor as an inverter, direct coupled transistor logic (DCTL), resistor transistor logic (RTL), diode transistor logic (DTL) or transistor transistor logic (TTL) and non-saturation mode logic such as emitter coupled logic (ECL) and complementary transistor logic (CTL). In saturation mode logic, as the saturated condition and cut-off condition of the inverter transistor, that is, the maximum condition and minimum condition of the stored energy correspond to the ON and OFF conditions of the gate, the operating speed is inherently low.

On the other hand, in ECL circuits, as the current switch transistors having the function of logic gates operate in non-saturated condition, the operating speed is very high. However, ECL circuitry has a deficiency in that the power consumption is high. First, the constant current circuit requires a relatively large voltage and consumes unnecessary electric power. Further, whether the gate is ON or OFF, the total current of the gate will be the same and the power consumption will be high.

BACKGROUND ART

There is a very sizable number of logic circuits known to the art. It is to be appreciated with reference to the subject invention, that the following art is not submitted to be the only prior art, the best prior art, or the most pertinent prior art.

U.S. Pat. No. 3,450,896 entitled "Transistor Switching Circuit Having Compensated Circuit" granted June 17, 1980 to Kenji Tanguchi et al.

U.S. Pat. No. 3,522,446 entitled "Current Switching Logic Circuit" granted Aug. 26, 1968 to Koji Kodama.

U.S. Pat. No. 3,579,272 entitled "Logic Circuits" granted May 18, 1971 to Richard Foss et al.

U.S. Pat. No. 3,656,004 entitled "Bipolar Capacitor Driver" granted Apr. 11, 1972 to Douglas W. Kemerer et al U.S. Pat. No. 3,787,737 entitled "High Speed/Logic Circuit" granted Jan. 22, 1974 to Hisakazu Mukai.

U.S. Pat. No. 3,836,792 entitled "Four Stage Storage Enhanced Logic Circuit" granted Sept. 17, 1974 to John P. Eckert, Jr. et al.

U.S. Pat. No. 4,039,867 entitled "Current Switch Circuit Having An Active Load" granted Aug. 2, 1977 to Richard Jay Blumberg et al.

U.S. Pat. No. 4,112,314 entitled "Logical Current Switch" granted Sept. 5, 1978 to Venkappa L. Gani et al.

U.S. Pat. No. 4,321,490 entitled "Transistor Logic Output For Reduced Power Consumption And Increased Speed During Low to High Transition" granted Mar. 23, 1982 to Robert W. Bechdolt.

U.S. Pat. No. 4,339,676 entitled "Logic Circuit Having A Selectable Output Mode" granted July 13, 1982 to Richard A. Ramsey.

Publication:

"Voltage Booster" by A. H. Dansky et al, IBM Technical Disclosure Bulietin, Vol. 26, No. 7B, Dec. 1983, pages 3618-19.

SUMMARY OF THE INVENTION

The primary object of the invention is to provide an improved logic circuit having high switching speed and low power consumption.

An object of the invention is to provide a high speed low power logic circuit having a self-contained power supply regulator.

An object of the invention is to provide a high speed low power logic circuit having a high input impedance and a low output impedance.

An object of the invention is to provide a high speed low power logic circuit particularly suitable for redundant circuit applications.

An object of the invention is to provide a high speed low power logic circuit having power supply noise immunity.

The invention may be summarized as a Complementary Cascoded Logic ($C^2L$) Circuit which performs the AND-INVERT (AI) (or NAND) function. The AND function is implemented with input PNP transistors and the invert function is implemented with a first NPN transistor. An inverted NPN transistor serves as a current source for the first NPN. A first low voltage Schottky diode is serially connected between the emitter of the first NPN transistor and the emitter of the inverted NPN current source transistor. The first Schottky diode precludes, under certain conditions, simultaneous conduction of the first NPN transistor and the inverted transistor. Oppositely poled second and third low voltage Schottky diodes are utilized via an emitter follower output to provide an output voltage swing of $V_R \pm V_F$, where $V_R$ is a reference voltage and $V_F$ is the potential drop across a Schottky diode. A low power high speed logic circuit having particular utility in redundant circuit applications is disclosed.

BRIEF DESCRIPTION OF THE DRAWING

The foregoing and other objects, features and advantages of the invention will be apparent from the following more particular description of the preferred embodiment of the invention as illustrated in the accompanying drawings.

FIG. 2 discloses idealized waveforms to be viewed in conjunction with explanation of the operation of the logic circuit of FIG. 1.

FIG. 3A illustrates a known three gate logic chain.

FIG. 3B illustrates a redundant circuit (active redundancy) employing logic circuits in accordance with the invention.

FIG. 1 discloses a Complementary Cascoded Logic ($C^2L$) circuit in accordance with the invention, which performs a logical AND-INVERT (AI) function. If input A, B, or C to one or more of the input transistors, T1, T2, or T3 is at a low logic level, the output of the circuit will be at a high logic level. A low logic level input will establish the voltage at the emitters of the PNP transistors T1, T2, and T3.

Figure 1:
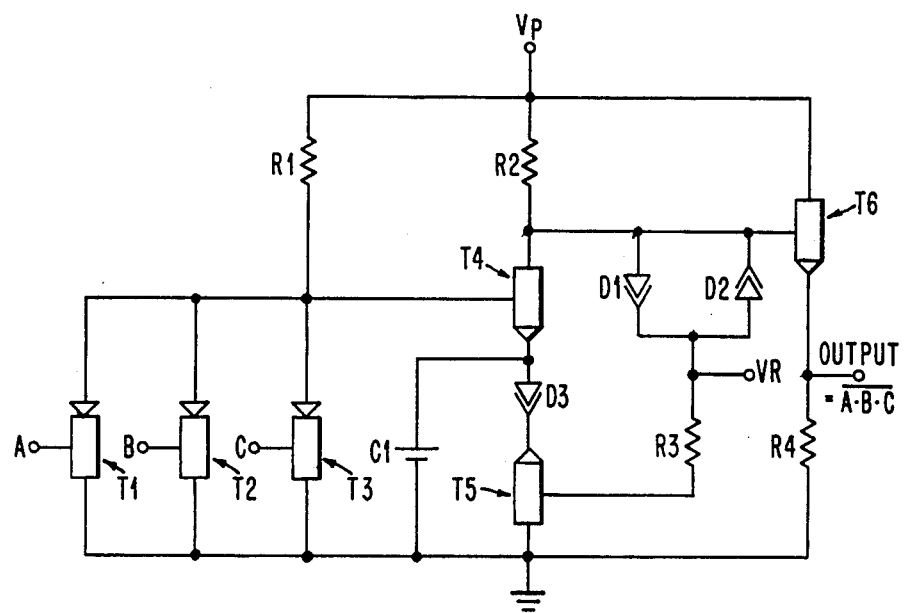
FIG. 1 is a schematic circuit diagram of an embodiment of a complementary cascoded logic circuit in accordance with the invention.

The resulting voltage at the base of T4 will not forward bias the base-emitter junction of T4 and low barrier Schottky diode D3, forcing them into a non-conductive state. The current flow through resistor R2 will result in two alternate conductive paths. The first conductive path is from the positive supply $V_P$ through R2 and the base-emitter junction of T6. As in ECL circuits, output transistor T6 is always on establishing the output voltage level as a forward biased base-emitter junction voltage below its base voltage. Typically, the base current of T6 through R2 determines the base voltage of T6. This conductive path would directly reflect variations in the value of the positive supply to the output of the circuit.

The second conductive path eliminates the direct dependency of the output level on positive supply voltage. This conductive path consists of resistor R2, low barrier Schottky diode D1 and reference voltage $V_R$. When T4 and D3 become non-conductive, the voltage at the base of T6 will begin to rise until the level attains a forward biased low barrier Schottky diode voltage ($V_F$) above reference supply $V_R$. Diode D1 will conduct current and clamp the voltage at the base of T6 to a forward biased low barrier Schottky diode voltage above reference supply $V_R$. Variations in the positive supply are absorbed by this clamping action, eliminating the direct dependency of the circuits high output voltage level on the positive supply.

For the opposite state of operation, transistor T4 and diode D3 will conduct current only when all of the inputs to the circuit are at a high logic level and once again two alternate conductive paths exist. The first conductive path is from the positive supply $V_P$ through resistor R2. Typically, the current requirement of T4 and D3 through R2 determines the base voltage of T6. This conductive path would directly reflect variations in the value of the positive supply to the output of the circuit.

The second conductive path again eliminates the direct dependency of this output level on positive supply voltage. This conductive path consists of low barrier Schottky diode D2 and the reference voltage $V_R$. When T4 and D3 become conductive, the voltage at the base of T6 will begin to fall until the level attains a forward biased low barrier Schottky diode voltage ($V_F$) below reference supply $V_R$. Diode D2 will conduct current and clamp the voltage at the base of T6 to a forward biased low barrier Schottky diode voltage below reference supply $V_R$. Variations in the positive supply are absorbed by this clamping action, eliminating the direct dependency of the circuits low output voltage level on the positive supply.

The generation (not shown) of the reference supply voltage $V_R$ would be implemented on the chip utilizing this circuit family. The design of this supply voltage would include the capability to track the operation of the circuit with power supply, process, and temperature variations. As described, this reference voltage in association with low barrier Schottky diodes D1 and D2 clamp the low and high output logic levels of the circuit:

(high output) $V_H = V_R + V_F(D1) - V_{BE}(T6)$ (low Output) $V_L = V_R - V_F(D2) - V_{BE}(T6)$ This clamping action establishes a controlled environment for the output voltage swing of the circuit, $V_R \pm V_F$, in addition to providing the circuit with power supply noise immunity. The minimum output voltage swing maximizes rhe performance of the circuit.

A significant aspect of this circuit is the use of PNP transistors (as emitter followers) to implement the AND function at the input of the circuit.

Typical bipolar logic circuits, ECL, TTL, SCS, use NPN transistors as inputs to the circuits. The inherent internal capacitances, collector to base (CCB) and collector to substrate (CCS), of these devices directly affects their performance. The performance impact related to CCB can be directly attributed to the MILLER effect theorem. The voltage at the collector of a NPN transistor is out of phase with the voltage at its base, resulting in twice the voltage change across CCB. The effect of this voltage is to double the CCB capacitance effect, reducing circuit performance. The collectors of input NPN transistors are common. The total capacitance at the collector node is the summation of the individual CCS capacitances. The CCB and CCS capacitance of an NPN transitor reduces the performance of these circuits by adding capacitance to the switching path of the circuit. The use of the PNP as an emitter follower at the input to the circuit reduces the amount of capacitance in the switching path, thereby improving the performance of the circuit. The internal emitter-base capacitance of the PNP device provides an in phase AC path to charge and discharge the base of transistor T4.

Typical bipolar AI circuits, such as TTL, require large amounts of current to perform the logic function. The operation of these circuits are susceptible to the voltage drops that occur as a result of this current flow. The physical distance between these circuits must be minimized to reduce the effects of the voltage drop. This distance between circuits and the amount of current required to maintain functionality, at worst case conditions, are two of the factors which determine the drive capability of a circuit. The inherent operation of the PNP input maximizes the drive capability of the $C^2L$ circuit by reducing the current flow required to sustain functionallity. The current that flows between circuits is the base current of the PNP. This current would be a function of the gain of the PNP and the PNP emitter current established within the circuit. The PNP input emitter follower allows the circuit to achieve high input impedance, a desired trait of VLSI circuits. Minimization of the PNP base current results in an increase of the input impedance of the circuit, further improving the performance of the C²L circuit.

The C²L circuit is a high performance, low power, bipolar logic circuit. The use of PNP transistors reduces the total capacitance in the switching path thereby allowing maximum performance. The use of low barrier Schottky diodes minimizes circuit power dissipation and establishes a minimum symmetrical voltage swing which reduces the circuit delay.

Still referring to FIG. 1, the following illustrative circuit parameters are set-forth.

| | |
|---|---|
| $V_P$ = 1.7 volts | C1 = 0.5 pico-farads (pf) |
| R1 = 2.4K ohms | |
| R2 = 2.4K ohms | $V_R$ = 1.1 volts |
| R3 = 7.7K ohms | |
| R4 = 1.5K ohms | |

Note:
A 5 gigahertz $F_t$ NPN transistor operating at 1 millampere would require a C1 = 1.06 (pf) capacitance Reference is made to the circuit of FIG. 1 and the idealized waveforms of FIG. 2.

CIRCUIT OPERATION

The AND function at the emitters of the input PNP transistors establishes the base of T4 as a forward biased PNP emitter-base junction voltage above the input level of the circuit.

LOW LOGIC LEVEL INPUT

A low logic level, 0.1 volts, at either of the input transistors sets the voltage at the base of T4 to 0.85 volts. This voltage level will not forward bias the base-emitter junction of T4 and low barrier Schottky diode D3, forcing them into a non-conductive state. Resistor R1 will provide the emitter current, 0.35 mA, for the input PNP transistors. The resulting PNP base current will be determined by the PNP device characteristics and the number of inputs at the low logic level. The maximum base current will occur when one input is at a low logic level. For a beta of 49, the maximum base current will be 0.007 mA. This current level establishes the input as a high DC impedance, minimizing load effects on the circuit providing the low logic level input. Minimization of the loading effects increases the fan out capabilities of the logic circuit. In addition, the common collector configuration of the input PNP transistors minimizes the AC effects of CCB maximizing AC impedance.

When T4 and D3 are not conducting current, the switchable current source transistor T5 saturates and the current flow through resistor R2 will result in two alternate conductive paths.

Resistor R3 will provide transistor T5 with continuous base current. The effective base-collector capacitance of a normal operating NPN transistor increases when the device is saturated. This increase in capacitance reduces the AC performance of a saturated NPN during normal operation. The AC effects of saturating T5 are minimized by use of the inverse operation characteristics of the NPN transistor. When T4 and D3 are off, the base-emitter junction of T5 will forward bias, charging the internal device capacitance of this junction. Minimization of the charge stored within this device improves the AC performance of T5 as a switchable current source. (Note: The schematic shows $V_R$ as the voltage source of resistor R3. This is not a requirement for circuit operation. The positive supply, $V_P$, may be used in conjunction with an increase in the value of resistor R3.)

The conductive paths clamp the base of T6 to a forward biased low barrier Schottky diode voltage (0.25 volts) above reference supply $V_R$ (1.1 volts), or 1.35 volts. Transistor T6 is used as an emitter follower to set the output voltage level as a forward biased base-emitter junction voltage below its base. Variations in the positive supply are absorbed by the clamping action of diode D1, eliminating the direct dependency of the circuits high output voltage level (0.60 volts) on the positive supply.

LOW-HIGH INPUT TRANSITION

The emitter follower action of the PNP input transistors provides an in phase path to establish the voltage at the base of T4. As the input approaches a high logic level, the voltage at the base of T4 also increases.

The increase in voltage at the base of T4 will cause T4 to conduct current when the base attains the cut-in voltage level of the base-emitter junction (0.7 volts), above the return supply. At this voltage, by-pass capacitor C1 provides a low impedance AC path to the return supply allowing T4 to turn on rapidly. The base of T4 will continue to rise forward biasing diode D3. The previously dormant switchable current source, transistor T5, will now provide a conductive path for the DC current flow of T4 and D3.

When T4 and D3 become conductive, two alternate conductive paths also exist. The voltage at the base of T6 will begin to fall, as a result of the current flow through resistor R2, until the level attains a forward biased low barrier Schottky diode voltage (0.25 volts) below reference supply $V_R$ (1.1 volts) or 0.85 volts. Diode D2 will conduct current and clamp the voltage at the base of T6 to a forward biased low barrier Schottky diode voltage below reference supply $V_R$. Variations in the positive supply are absorbed by the clamping action of diode D2, eliminating the direct dependency of the circuits low output voltage level (0.10 volts) on the positive supply.

The increase in voltage at the base of T4 also reduces the current flow through resistor R1 (0.15 mA). This reduction in current reduces the PNP emitter and base currents forcing them into a higher impedance state further improving the load requirements of the circuit.

HIGH-LOW INPUT TRANSITION

The emitter follower action of the PNP input transistors once again provides an in phase path to establish the voltage at the base of T4. As the input approaches a low logic level, the voltage at the base of T4 also decreases.

Due to the action of capacitor C1, the decrease in voltage at the base of T4 will reduce the current flow through T4 and D3. The voltage at the base of T6 will begin to rise, as a result of the reduction of current flow through resistor R2 and diode D2, until the level attains a forward biased low barrier Schottky diode voltage (0.25 volts) above reference supply $V_R$ (1.1 volts) or 1.35 volts. Diode D1 will conduct current and clamp the voltage at the base of T6 to a forward biased low barrier Schottky diode voltage below reference supply $V_R$. Variations in the positive supply are absorbed by the clamping action of diode D2, eliminating the direct dependency of the circuits low output voltage level (0.10 volts) on the positive supply.

The C²L circuit is particularly suited for redundancy applications used to implement Wafer Scale Integration (WSI). A primary goal of redundancy design is to insure logic functionality in the presence of random process defects. Redundant logic designs eliminate the effects of process defects by providing multiple paths for logic "continuity". Active redundancy will be used as an illustrative embodiment of the application of the C²L circuit.

Active redundancy is a method of design that requires multiple hardware and wiring. This method is tolerant of defects that result in faults which cause the input or output of a circuit to be in a non-controlling state. The controlling state of a circuit is defined as the logical input level that governs the logic level of the output. The non-controlling state is defined as the logic input level that sets the logic level of the output only when all inputs to the circuit are at the non-controlling state. The word "Active" means that the corrections occur instantaneously and require no checking or diagnostic programming.

Active redundancy is implemented by doubling the fan in and fan out of the non-redundant circuit, in addition to the requirement of duplicating the circuit. FIG. 3a illustrates a non-redundant, three gate logic chain, for a single fan in and fan out gate. FIG. 3b illustrates the same logic chain implemented with Active redundancy.

The duplicate gates of A, B, AND C are A', B' and C', respectively. The output of each gate is fed to the subsequent gate in the chain and its duplicate. The doubling of the fan in and fan out provides an alternate path of logic flow. If a gate has a defect which causes its input or output to be in a non-controlling state, logic will flow through the duplicate gate. This allows the logic to instantaneously correct itself by absorbing the defect through the alternate path. Defects that cause controlling states on any gates input or output will not be absorbed.

The functionality of this form of redundancy is determined by the circuits susceptibility to process defects which result in controlling state defects. Typical high speed logic circuits have the same logic capability, OR, at both the input and output of the circuit. These circuit types have a high logic level as the controlling state. Unfortunately, the predominate state caused by typical process defects is a high logic level, making these circuits unsuitable for Active redundancy WSI.

As previously described, the controlling and non-controlling states of the C²L circuit are the low and high logic level, respectively. The logic functions at the input and output of C²L are AND and OR, respectively. The complementary logic functions at the input and output allows C²L to absorb defects that result in a high logic level. Typical defects, such as transistor pipes and opens or shorts within the intercircuit metal do not force the output or input of C²L to a controlling state.

While the invention has been particularly shown and described with reference to the preferred embodiment thereof, it will be understood by those skilled in the art that various changes in form and detail may be made therein without departing from the spirit and scope of the invention.

What is claimed is:

1. A high switching speed low power logical circuit for performing a logical function, said logical circuit comprising:

input circuit means, said input circuit means having at least first and second input terminals and reduced capacitance;

a first transistor having a collector, base and emitter, said base of said first transistor connected to said input circuit means;

a first resistor connected between said base of said first transistor and a first source of potential;

a second resistor connected between said collector of said first transistor and said first source of potential;

active current source means connected between said emitter of said first transistor and a second source of potential, said active current source means including the serial interconnection of a diode and an inversely operated transistor, said inversely operated transistor having a collector, base and emitter, said collector of said inversely operated transistor connected to said input circuit means and to a second potential source;

circuit means including a reference source of potential connected between said base of said inversely operated transistor and said collector of said first transistor;

a second transistor having a collector base and emitter, said collector of said second transistor connected to said first source of potential, said base of said second transistor connected to said collector of said first transistor;

a third resistor serially connected between the emitter of said second transistor and said second potential source; and an output terminal connected to said emitter of said second transistor.

2. A high switching speed low power logical circuit for performing a logical function, as recited in claim 1, wherein said input circuit means includes at least first and second PNP type transistors, each of said PNP type transistors having a collector, base and emitter, said emitters of said PNP type transistors connected in common to said base of said first transistor, said collectors of said first and second PNP type transistors connected in common to said collector of said inversely operated transistor, said bases of said first and second PNP type transistors respectively connected to said first and second input terminals, and wherein said first transistor, said inversely operated transistor and said second transistor are respectively NPN type transistors.

3. A high switching speed low power logical circuit for performing a logical function, as recited in claim 2, wherein said active current source means includes a low voltage Schottky diode having an anode and a cathode and an inversely operated NPN type transistor, said anode of said Schottky diode connected to said emitter of said first transistor, said cathode of said Schottky diode connected to said emitter of said inversely operated transistor.

4. A high switching speed low power logical circuit for performing a logical function, as recited in claim 3, wherein said circuit means including a source of reference potential includes first and second low voltage Schottky diodes, said anode of said first Schottky diode connected to said collector of said first NPN transistor, said cathode of said second Schottky diode connected to said collector of said first NPN transistor, and a resistor connected between said base of said inversely operated transistor and a common connection of said cathode of said first Schottky diode and said anode of said second Schottky diode.

5. A high switching speed low power logical circuit for performing a logical function, as recited in claim 4, wherein said active current source means includes a speed-up capacitor connected between said emitter of said first transistor and said collector of said inversely operated transistor.

6. Logic circuit means employing active redundancy, said logic circuit means comprising:
at least first, second, third, fourth, fifth, and sixth logic circuits;
said first and said second logic circuits each having at least one input and an output;
said third logic circuit having a first input, a second input and an output, said first input of said third logic circuit connected to said output of said first logic circuit, said second input of said third logic circuit connected to said output of said second logic circuit;
said fourth logic circuit having a first input, a second input and an output, said first input of said fourth logic circuit connected to said output of said first logic circuit, said second input of said fourth logic circuit connected to said output of said second logic circuit;
said fifth logic circuit having a first input, a second input and an output, said first input of said fifth logic circuit connected to said output of said third logic circuit, said second input of said fifth logic circuit connected to said output of said fourth logic circuit;
said sixth logic circuit having a first input, a second input and an output, said first input of said sixth logic circuit connected to said output of said third logic circuit, said second input of said sixth logic circuit connected to said output of said fourth logic circuit; and
said logic circuit means being further characterized by each of said first through sixth logic circuits being a complementary cascoded logic ($C^2L$) circuit, wherein each complementary cascoded logic ($C^2L$) circuit comprises:
input circuit means, said input circuit means having at least first and second input terminals and reduced capacitance;
a first transistor having a collector, base and emitter, said base of said first transistor connected to said input circuit means;
a first resistor connected between said base of said first transistor and a first source of potential;
a second resistor connected between said collector of said first transistor and said first source of potential;
active current source means connected between said emitter of said first transistor and a second source of potential, said active current source means including the serial interconnection of a diode and an inversely operated transistor, said inversely operated transistor having a collector, base and emitter, said collector of said inversely operated transistor connected to said input circuit means and to a second potential source;
circuit means including a reference source of potential connected between said base of said inversely operated transistor and said collector of said first transistor;
a second transistor having a collector, base and emitter, said collector of said second transistor connected to said first source of potential, said base of said second transistor connected to said collector of said first transistor;
a third resistor serially connected between the emitter of said second transistor and said second potential source; and
an output terminal connected to said emitter of said second transistor,
whereby said circuit means is capable of obviating at least certain defects or faults in at least one of said first through sixth complementary cascoded logic circuits.

7. Logic circuit means employing active redundancy, as recited in claim 6, wherein said input circuit means includes at least first and second PNP type transistors, each of said PNP type transistors having a collector, base and emitter, said emitters of said PNP type transistors connected in common to said base of said first transistor, said collectors of said first and second PNP type transistors connected in common to said collector of said inversely operated transistor, said bases of said first and second PNP type transistors respectively connected to said first and second input terminals, and wherein said first transistor, said inversely operated transistor and said second transistor are respectively NPN type transistors.

8. Logic circuit means employing active redundancy, as recited in claim 7, wherein said active current source means includes a low voltage Schottky diode having an anode and a cathode and an inversely operated NPN type transistor, said anode of said Schottky diode connected to said emitter of said first transistor, said cathode of said Schottky diode connected to said emitter of said inversely operated transistor.

9. Logic circuit means employing active redundancy, as recited in claim 8, wherein said circuit means including a source of reference potential includes first and second low voltage Schottky diodes, said anode of said first Schottky diode connected to said collector of said first NPN transistor, said cathode of said second Schottky diode connected to said collector of said first NPN transistor, and a resistor connected between said base of said inversely operated transistor and a common connection of said cathode of said first Schottky diode and said anode of said second Schottky diode.

10. Logic circuit means employing active redundancy, as recited in claim 9, wherein said active current source means includes a speed-up capacitor connected between said emitter of said first transistor and said collector of said inversely operated transistor.

11. A high switching speed low power logical circuit for performing a logical function, said logical circuit comprising:
input circuit means, said input circuit means having at least first and second input terminals and reduced capacitance;
a first transistor having a collector, base and emitter, said base of said first transistor connected to said input circuit means;
a first resistor connected between said base of said first transistor and a first source of potential;
a second resistor connected between said collector of said first transistor and said first source of potential;
active current source means connected between said emitter of said first transistor and a second source of potential, said active current source means including the serial interconnection of a diode and an inversely operated transistor; and, output circuit means coupled to said input circuit means and said active current source means.

12. A high switching speed low power logical circuit for performing a logical function, said logical circuit comprising:
   input circuit means, said input circuit means including at least first and second input terminals;
   output circuit means, said output circuit means including an output terminal; and,
   circuit means coupling said input circuit means to said output circuit means, said logic circuit being characterized in that said circuit means coupling said input circuit means to said output circuit means includes an active current source means consisting essentially of the serial interconnection of a diode and an inversely operated transistor.

13. Logic circuit means employing active redundancy, said logic circuit means comprising:
   at least first, second, third and fourth logic circuits;
   said first and second logic circuits each having at least one input and an output;
   said third logic circuit having a first input, a second input and an output, said first input of said third logic circuit connected to said output of said first logic circuit, said second input of said third logic circuit connected to said output of said second logic circuit;
   said fourth logic circuit having a first input, a second input and an output, said first input of said fourth logic circuit connected to said output of said first logic circuit, said second input of said fourth logic circuit connected to said output of said second logic circuit;
   said logic circuit means being characterized by each of said first through fourth logic circuits being a complementary cascoded logic (C²L), wherein each complementary cascoded logic (C²L) circuit comprises:
   input circuit means, said input circuit means having at least first and second input terminals and reduced capacitance;
   a first transistor having a collector, base and emitter, said base of said first transistor connected to said input circuit means;
   a first resistor connected between said base of said first transistor and a first source of potential;
   a second resistor connected between said collector of said first transistor and said first source of potential;
   active current source means connected between said emitter of said first transistor and a second source of potential, said active current source means including the serial interconnection of a diode and an inversely operated transistor, said inversely operated transistor having a collector, base and emitter, said collector of said inversely operated transistor connected to said input circuit means and to a second potential source;
   circuit means including a reference source of potential connected between said base of said inversely operated transistor and said collector of said first transistor;
   a second transistor having a collector, base and emitter, said collector of said second transistor connected to said first source of potential, said base of said second transistor connected to said collector of said first transistor;
   a third resistor serially connected between the emitter of said second transistor and said second potential source; and
   an output terminal connected to said emitter of said second transistor;
   whereby said circuit means is capable of obviating at least certain defects or faults in at least one of said first through fourth complementary cascoded logic circuits.

14. Logic circuit means employing active redundancy, as recited in claim 13, wherein said input circuit means includes at least first and second PNP type transistors, each of said PNP type transistors having a collector, base and emitter, said emitters of said PNP type transistors connected in common to said base of said first transistor, said collectors of said first and second PNP type transistors connected in common to said collector of said inversely operated transistor, said bases of said first and second PNP type transistors respectively connected to said first and second input terminals, and wherein said first transistor, said inversely operated transistor and said second transistor are respectively NPN type transistors.

15. Logic circuit means employing active redundancy, as recited in claim 14, wherein said active current source means includes a low voltage Schottky diode having an anode and a cathode and an inversely operated NPN type transistor, said anode of said Schottky diode connected to said emitter of said first transistor, said cathode of said Schottky diode connected to said emitter of said inversely operated transistor.

16. Logic circuit means employing active redundancy, as recited in claim 15, wherein said circuit means including a source of reference potential includes first and second low voltage Schottky diodes, said anode of said first Schottky diode connected to said collector of said first NPN transistor, said cathode of said second Schottky diode connected to said collector of said first NPN transistor, and a resistor connected between said base of said inversely operated transistor and a common connection of said cathode of said first Schottky diode and said anode of said second Schottky diode.

17. Logic circuit means employing active redundancy, as recited in claim 16, wherein said active current source means includes a speed-up capacitor connected between said emitter of said first transistor and said collector of said inversely operated transistor.

* * * * *